United States Patent
Fujiwara

(10) Patent No.: US 6,208,583 B1
(45) Date of Patent: Mar. 27, 2001

(54) SYNCHRONOUS SEMICONDUCTOR MEMORY HAVING AN IMPROVED READING MARGIN AND AN IMPROVED TIMING CONTROL IN A TEST MODE

(75) Inventor: Keisuke Fujiwara, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/430,298

(22) Filed: Oct. 29, 1999

(30) Foreign Application Priority Data

Oct. 29, 1998 (JP) .................................................. 10-309126

(51) Int. Cl.[7] ...................................................... G11C 8/00
(52) U.S. Cl. ............................................. 365/233; 365/201
(58) Field of Search ..................................... 365/233, 201

(56) References Cited

U.S. PATENT DOCUMENTS

| | | | |
|---|---|---|---|
| 5,581,512 | 12/1996 | Kitamura | 365/233 |
| 6,041,002 | * 3/2000 | Meajima | 365/201 |
| 6,061,294 | * 5/2000 | Koshikawa | 365/233 |
| 6,069,829 | * 5/2000 | Komai et al. | 365/201 |

* cited by examiner

Primary Examiner—David Nelms
Assistant Examiner—Connie C. Yoha
(74) Attorney, Agent, or Firm—Sughrue, Mion, Zinn, Macpeak & Seas, PLLC

(57) ABSTRACT

A synchronous semiconductor memory comprises a memory controller receiving a pre-CAS signal and a test-CAS signal for outputting the test-CAS signal as the CAS signal when a mode discrimination signal is active to indicate a test mode, and the pre-CAS signal as the CAS signal when the mode discrimination signal is inactive. A data amplifier controller receives the CAS signal and a clock signal and generates a data amplifier enable signal in time with the clock signal when the mode discrimination signal is inactive. This data amplifier control generates the data amplifier enable signal by delaying the CAS signal when the mode discrimination signal is inactive. In response to a column selection signal, data stored in the memory cell array is outputted to associated data amplifiers. When the associated data amplifiers are enabled by the data amplifier enable signal, the data outputted from the memory cell array is amplified and outputted by the associated data amplifiers.

16 Claims, 8 Drawing Sheets

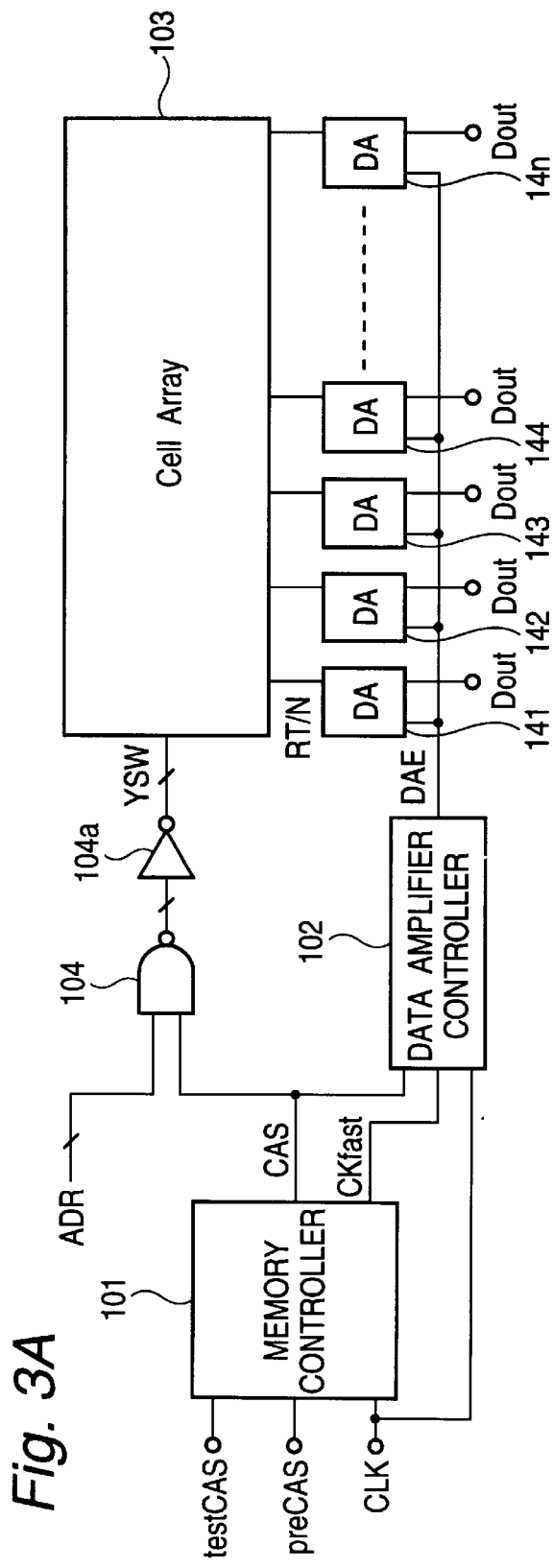
*Fig. 3A*
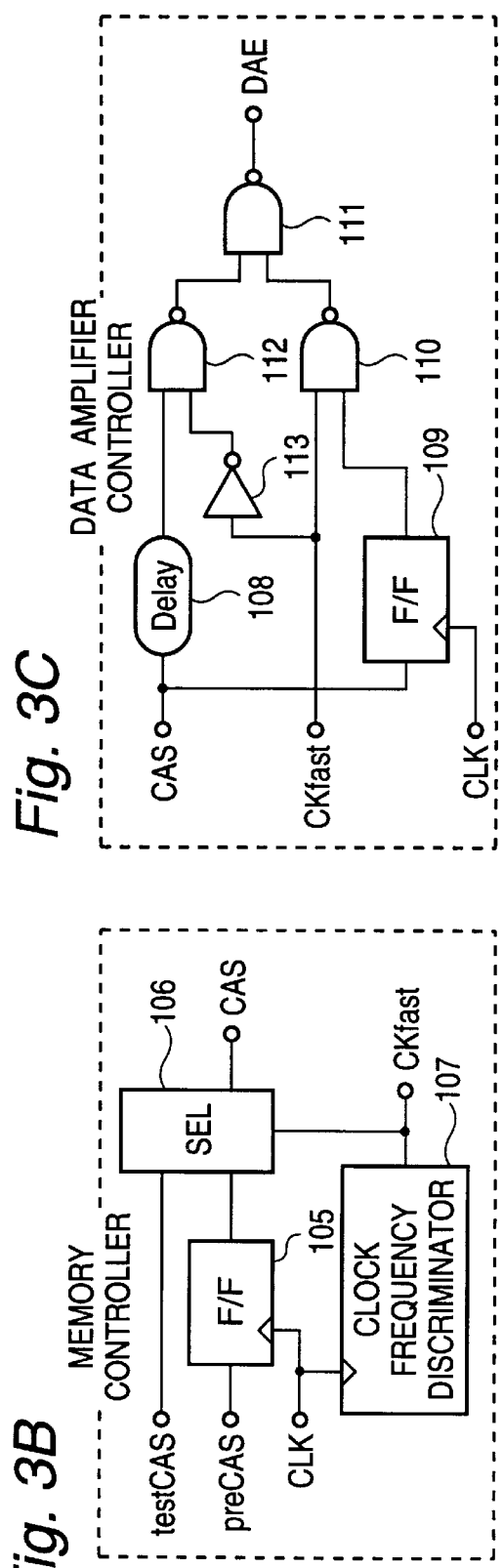
*Fig. 3C*
*Fig. 3B*

Fast Condition (high frequency operation)

Slow Condition (high frequency operation)

timing path (clock)

data amplifier controller timing path (clock)

timing path (delay)

data amplifier controller timing path (delay)

SYNCHRONOUS SEMICONDUCTOR MEMORY HAVING AN IMPROVED READING MARGIN AND AN IMPROVED TIMING CONTROL IN A TEST MODE

BACKGROUND OF THE INVENTION

The present invention relates to a semiconductor memory, and more specifically to a synchronous semiconductor memory having an improved reading margin and an improved timing control in a test mode.

Referring to FIGS. 1A, 1B and 1C, there are shown block diagrams illustrating a control circuit of a data amplifier section of a prior art synchronous semiconductor memory. FIGS. 2A and 2B are timing charts illustrating an operation of the synchronous semiconductor memory shown in FIGS. 1A, 1B and 1C, in different operation conditions.

As shown in FIG. 1A, the prior art synchronous semiconductor memory includes a memory controller 101, a data amplifier controller 602, a memory cell array 103 and a number of data amplifiers 141 to 14n, which are coupled as shown. The memory controller 101 receives a test-CAS (column address strobe) signal "testCAS", a pre-CAS signal "preCAS" and a clock signal CLK, and generates a CAS signal CAS. Here, the pre-CAS signal preCAS is a preceding signal for generating the CAS signal CAS, and is used as the CAS signal CAS in a high frequency operation (actual use condition; on the order of a few ns to a few 10 ns). On the other hand, the test-CAS signal testCAS is used as the CAS signal. CAS in a low frequency operation (test mode condition; on the order of a few 10 ns to a few 100 ns).

The CAS signal CAS is supplied to a NAND gate 104 located before the memory cell array 103, and also to the data amplifier controller 602. This data amplifier controller 602 generates a data amplifier enable signal DAE to the data amplifiers 141 to 14n. On the other hand, the NAND gate 104 receiving the CAS signal CAS also receives an address signal ADR, so that a logical NAND between the CAS signal CAS and the address signal ADR is outputted to an inverter 104a, which outputs a column selector signal YSW to the memory cell array 103. Each of the data amplifiers 141 to 14n is enabled by the data amplifier enable signal DAE to amplify data RT/N from the memory cell array 103 and to output an output signal Dout.

As shown in FIG. 1B, the data amplifier controller 602 comprises a delay 108 and a pair of inverters 609 and 610, which are connected in cascade in the named order as shown. The CAS signal CAS is supplied to the delay 108, and outputted through the two cascaded inverters as the data amplifier enable signal DAE.

Furthermore, as shown in FIG. 1C, the memory controller 101 includes a flipflop 105, a selector 106 and a clock frequency discriminator 107, connected as shown. The pre-CAS signal preCAS and the clock CLK are supplied to the flipflop 105, and an output of the flipflop 105 is supplied to the selector 106. This selector also receives the test-CAS signal testCAS. The clock CLK is also supplied to the clock frequency discriminator 107, and the selector 106 is controlled by the clock frequency discriminator 107 on the basis of the frequency of the clock signal CLK, so that the selector 106 outputs one of the test-CAS signal and the output of the flipflop 105 as the CAS signal CAS.

As mentioned above, the pre-CAS signal preCAS is the preceding signal for generating the CAS signal CAS, and is used in the high frequency operation (actual use condition), and the test-CAS signal testCAS is used as the CAS signal CAS in the low frequency operation (test mode condition).

The column selection signal YSW is selected on the basis of the address signal ADR, and activated in time with the CAS signal CAS.

In the memory controller 101, the clock frequency discriminator 107 outputs a high level signal when the clock signal CLK is a high frequency, and a low level signal when the clock signal CLK is a low frequency. When the output of the clock frequency discriminator 107 is at the high level, the selector 106 selects the output of the flipflop 105, and when the output of the clock frequency discriminator 107 is at the low level, the selector 106 selects the test-CAS signal testCAS. Thus, as mentioned above, since the pre-CAS signal preCAS is in the preceding signal for generating the CAS signal CAS, the pre-CAS signal preCAS is used in the high frequency operation (actual use condition). On the other hand, in the low frequency operation (test mode condition), the test-CAS signal testCAS is used as the CAS signal CAS.

Incidentally, the reason for why a low frequency operation is required in the test mode is that, to test a peripheral circuit, a logic tester having a test rate on the order of a few 100 ns is used.

The data amplifier controller 602 outputs the CAS signal CAS through the delay 108 and the inverters 609 and 610 as the data amplifier enable signal DAE.

As shown in FIG. 2A, a time from a rising of the CAS signal CAS to the outputting of the output signal Dout is standardized as a time tdac, which is set to a predetermined value for each product. Here, it is important that after an amplifiable potential difference has been generated in a data signal RT/N (between a pair of complementary signals) outputted from the memory cell array 103, the data amplifiers 141 to 14n are enabled by the data amplifier enable signal DAE, and that the actual time from the rising of the CAS signal CAS to the outputting of the output signal Dout meets with the standardized time tdac.

Here, since a fast condition in which an internal clock operates at a high speed is determined by circuit elements and a use condition of the semiconductor device, and since a slow condition in which an internal clock operates at a slow speed is also determined by the circuit elements and a use condition of the semiconductor device, the time tRT/NC from the rising of the CAS signal CAS to the outputting of the data signal RT/N having the amplifiable potential difference is determined by the fast condition and the slow condition, and therefore, the timing of a rising of the data amplifier enable signal DAE is determined to meet with the time tRT/NC in the fast condition and the slow condition. In a clock synchronization, the difference between the fast condition and the slow condition in the time tDC from the rising of the CAS signal CAS to the rising of the data amplifier enable signal DAE, is larger than the difference between the fast condition and the slow condition in the time rRT/NC from the rising of the CAS signal CAS to the outputting of the data signal RT/N having the amplifiable potential difference. Therefore, if it is so set that in the fast condition, after the data signal RT/N has reached the amplifiable potential difference, the data amplifiers 141 to 14n are enabled by the rising of the rising of the data amplifier enable signal DAE, the access time from the rising of the CAS signal CAS to the outputting of the output signal Dout in the slow condition is required to come within the standardized time tdac.

In the synchronous semiconductor memory as mentioned above, the scale of the memory cell array is increasing with increase of a required memory capacity, with the result that a read path extending in the memory cell array is becoming long. If the read path becomes long, the time from the inputting of the CAS signal until the data is outputted to the data amplifier becomes long. If the data amplifier enable signal DAE is generated to meet with this timing by delaying the CAS signal by use of a delay element, a long delay becomes required from the inputting of the CAS signal to the activation of the data amplifier enable signal DAE, and correspondingly, variation in the timing for enabling the data amplifiers becomes large because of a process variation and changes in temperature and in voltage. As a result, possibility that the access time becomes out of the standardized time tdac will increase.

If the rising of the data amplifier enable signal DAE is adjusted to meet with the fast condition as shown in FIG. 2A, the time tDC from the rising of the CAS signal to the rising of the data amplifier enable signal DAE in the slow condition becomes too long, so that the access time comes out of the standardized time tdac, as shown in FIG. 2B. On the other hand, if the rising of the data amplifier enable signal DAE was so adjusted that the access time comes within the standardized time tdac in the slow condition, it results in that in the fast condition the data amplifier enable signal DAE is risen before the data signal RT/N has reached the amplifiable potential difference, with the result that the activated data amplifiers 141 to 14n erroneously sense the data outputted from the memory cell array.

BRIEF SUMMARY OF THE INVENTION

Accordingly, it is an object of the present invention to provide a synchronous semiconductor memory which has overcome the above mentioned problem of the prior art.

Another object of the present invention to provide a synchronous semiconductor memory capable of generating a data amplifier enable signal without being influenced by a process variation and changes in temperature and in voltage.

The above and other objects of the present invention are achieved in accordance with the present invention by a synchronous semiconductor memory comprising:

a memory control means receiving a pre-CAS signal and a test-CAS signal for outputting the test-CAS signal as a CAS signal when a mode discrimination signal is active to indicate a test mode, and the pre-CAS signal as the CAS signal when the mode discrimination signal is inactive;

a data amplifier control means receiving the CAS signal and a clock signal and for generating a data amplifier enable signal at a delay in time with the clock signal when the mode discrimination signal is inactive, the data amplifier control generating the data amplifier enable signal by delaying the CAS signal independently of the clock signal when the mode discrimination signal is inactive; and a memory cell array responding to a column selection signal to output data stored in the memory cell array to associated data amplifiers, so that when the associated data amplifiers are enabled by the data amplifier enable signal, the data is amplified and outputted by the associated data amplifiers.

In an embodiment of the synchronous semiconductor memory, the data amplifier control means includes an asynchronous delay means for delaying the CAS signal, asynchronously of the clock signal, to generate the data amplifier enable signal, and a clock-synchronized circuit receiving the CAS signal to delay the CAS signal, in synchronism with the clock signal, for generating the data amplifier enable signal in synchronism with the clock signal.

Specifically, the CAS signal is supplied to the asynchronous delay means, and preferably, the clock-synchronized circuit comprises a flipflop means receiving the CAS signal and the clock signal, and wherein the data amplifier control means includes further includes a first NAND gate receiving an output of the asynchronous delay means and also receiving through an inverter the mode discrimination signal, a second NAND gate receiving the mode discrimination signal and an output of the flipflop means, and a third NAND gate receiving an output of the first NAND gate and an output of the second NAND gate for outputting the data amplifier enable signal.

When the mode discrimination signal is inactive, the flipflop means receiving the CAS signal and the clock signal, generates the data amplifier enable signal from the CAS signal, in synchronism with a clock of the clock signal which is later, by one clock cycle, then a clock of the clock signal in synchronism with which the CAS signal is generated, and when the mode discrimination signal is active, the clock signal has a frequency lower than that of the clock signal when the mode discrimination signal is inactive, so that the asynchronous delay means generates the data amplifier enable signal, by delaying the CAS signal, asynchronously of the clock signal.

In a specific embodiment of the synchronous semiconductor memory, the memory control means includes a clock frequency discriminator receiving the clock signal for generating the mode discrimination signal which is active when the frequency of the clock signal is low and which is inactive when the frequency of the clock signal is high, a flipflop receiving the pre-CAS signal and the clock signal for latching the pre-CAS signal in synchronism with the clock signal, and a selector receiving the test-CAS signal and an output of the flipflop and controlled by the mode discrimination signal so as to select the test-CAS signal as the CAS signal when the mode discrimination signal is active and the output of the flipflop as the CAS signal when the mode discrimination signal is inactive.

In another specific embodiment of the synchronous semiconductor memory, the mode discrimination signal is an externally supplied test mode signal, and wherein the memory control means includes a flipflop receiving the pre-CAS signal and the clock signal for latching the pre-CAS signal in synchronism with the clock signal, and a selector receiving the test-CAS signal and an output of the flipflop and controlled by the test mode signal so as to select the test-CAS signal as the CAS signal when the test mode signal is active and the output of the flipflop as the CAS signal when the test mode signal is inactive.

With the above arrangement, since the data amplifier enable signal is generated in synchronism with an external clock, the data amplifier enable signal can be obtained without being influenced by a process variation and changes in temperature and in voltage.

The above and other objects, features and advantages of the present invention will be apparent from the following description of preferred embodiments of the invention with reference to the accompanying drawings.

BRIEF DESCRIPTION OF THE DRAWINGS

FIGS. 3A, 3B and 3C are block diagrams illustrating a control circuit of a data amplifier section in a first embodiment of the synchronous semiconductor memory in accordance with the present invention;

DETAILED DESCRIPTION OF THE INVENTION

Now, embodiments of the present invention will be described with reference to the drawings.

Figure 1A:
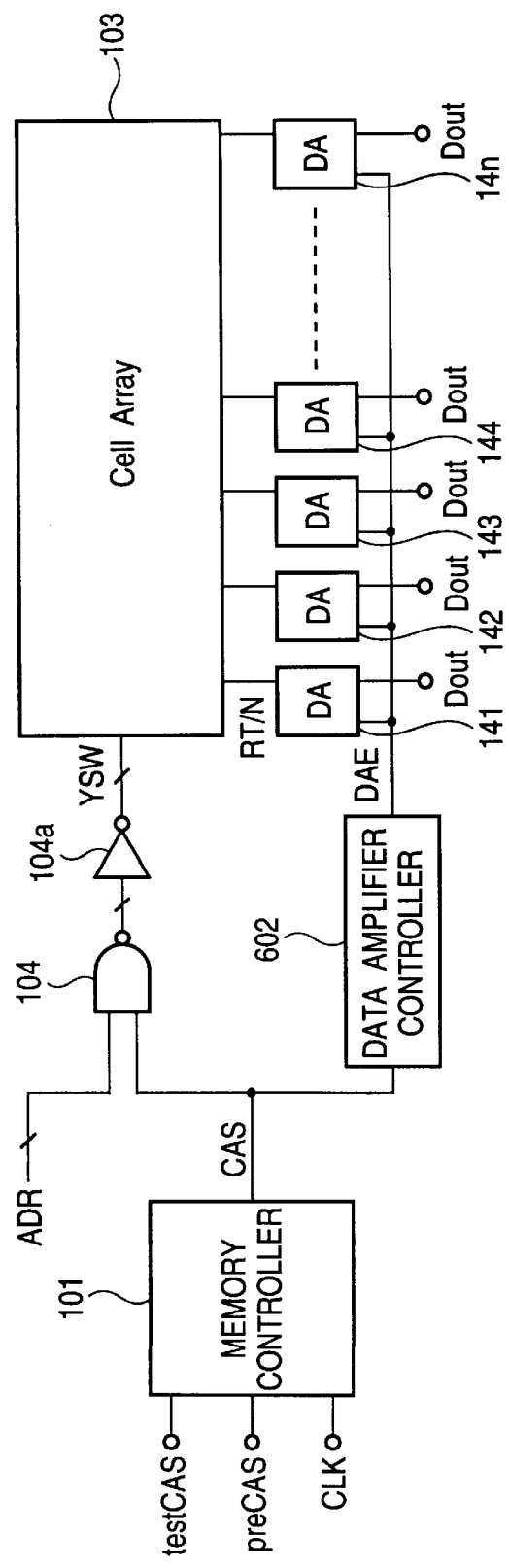
FIGS. 1A, 1B and 1C are block diagrams illustrating a control circuit of a data amplifier section of a prior art synchronous semiconductor memory.
Figure 1B:
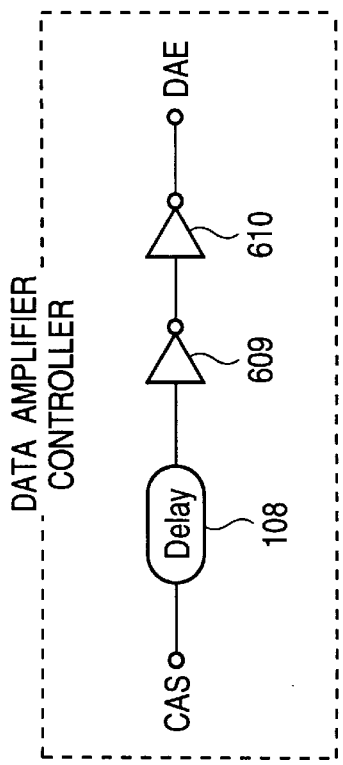
Figure 1C:
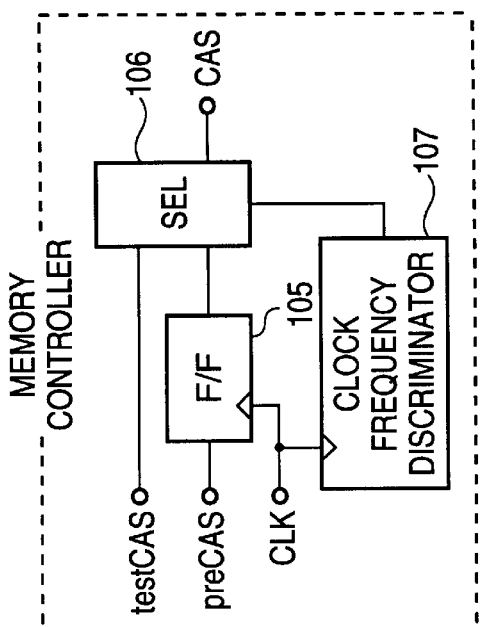
Figures 2A, 2B:
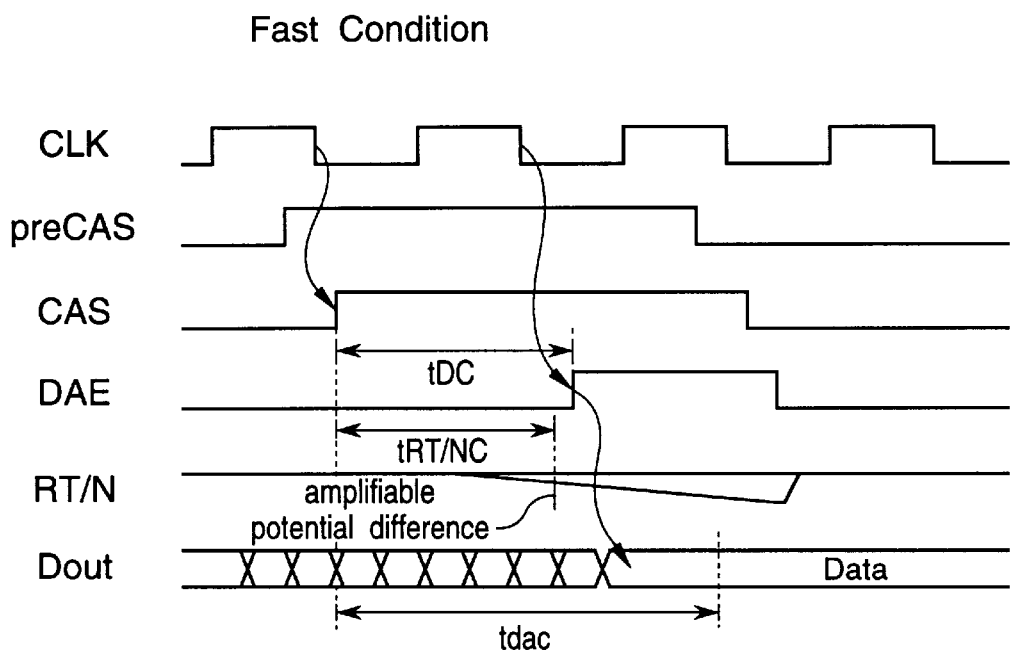
FIGS. 2A and 2B are timing charts illustrating an operation of the synchronous semiconductor memory shown in FIGS. 1A, 1B and 1C, in different operation conditions.

Referring to FIGS. 3A, 3B and 3C, there are shown block diagrams illustrating a control circuit of a data amplifier section in a first embodiment of the synchronous semiconductor memory in accordance with the present invention. In FIGS. 3A, 3B and 3C, elements corresponding to those shown in FIGS. 1A, 1B and 1C are given the same reference numbers.

As shown in FIG. 3A, the synchronous semiconductor memory includes a memory controller 101, a data amplifier controller 102, a memory cell array 103 and a number of data amplifiers 141 to 14n, which are coupled as shown. The memory controller 101 receives a test-CAS signal "testCAS", a pre-CAS signal "preCAS" and a clock signal CLK, and generates a CAS signal CAS. The CAS signal CAS is supplied to an NAND gate 104 located before the memory cell array 103, and also to the data amplifier controller 102. This data amplifier controller 102 generates a data amplifier enable signal DAE to the data amplifiers 141 to 14n. On the other hand, the NAND gate 104 receiving the CAS signal CAS also receives an address signal ADR, so that a logical NAND between the CAS signal CAS and the address signal ADR is outputted to an inverter 104a, which outputs a column selection signal YSW to the memory cell array 103. Each of the data amplifiers 141 to 14n is enabled by the data amplifier enable signal DAE to amplify data RT/N from the memory cell array 103 and to output an output signal Dout.

More specifically, as shown in FIG. 3B, the memory controller 101 includes a flipflop 105, a selector 106 and a clock frequency discriminator 107, connected as shown. The pre-CAS signal preCAS is supplied to a data input of the flipflop 105, and the clock signal CLK is supplied to a clock input of the flipflop 105, so that the pre-CAS signal preCAS is latched in the flipflop 105 in synchronism with the clock signal CLK (for example, in synchronism with a falling edge of the clock signal CLK in FIGS. 4A, 4B, 5A and 5B). An output of the flipflop 105 is supplied to the selector 106. This selector also receives the test-CAS signal testCAS. The clock signal CLK is also supplied to the clock frequency discriminator 107, which outputs a mode discrimination signal or a clock discrimination signal CKfast. The selector 106 is controlled by the clock frequency discriminator 107 on the basis of the frequency of the clock signal CLK, so that the selector 106 outputs one of the test-CAS signal and output of the flipflop 105 as the CAS signal CAS.

Furthermore, as shown in FIG. 3C, the data amplifier controller 102 comprises a delay 108, a flipflop 109, NAND gates 110, 111 and 112 and an inverters 113, which are connected as shown. The CAS signal CAS is supplied to the delay 108 and a data input of the flipflop 109. The clock signal CLK is supplied to a clock input of the flipflop 109, so that the CAS signal CAS is latched in the flipflop 109 in synchronism with the clock signal CLK (for example, in synchronism with a falling edge of the clock signal CLK in FIGS. 4A and 4B). An output of the delay 108 is connected to the NAND gate 112, and an output of the flipflop 109 is connected to the NAND gate 110. The clock discrimination signal CKfast is supplied to the NAND gate 110 and also through the inverter 113 to the NAND gate 112. An output of each of the NAND gates 110 and 112 is connected to the NAND gate 111, which outputs the data amplifier enable signal DAE. Here, the delay 108 is an asynchronous delay for delaying an input signal, independently of any clock signal, namely, asynchronously of any clock signal.

As explained hereinbefore, the pre-CAS signal preCAS is the preceding signal for generating the CAS signal CAS, and is used in the high frequency operation (actual use condition), and the test-CAS signal testCAS is used as the CAS signal CAS in the low frequency operation (test mode condition). The column selection signal YSW is selected on the basis of the address signal ADR, and activated in time with the CAS signal CAS.

In the memory controller 101, the clock discrimination signal CKfast outputted from the clock frequency discriminator 107 assumes a high level when the clock signal CLK is a high frequency, and a low level when the clock signal CLK is a low frequency. When the clock discrimination signal CKfast is at the high level, the selector 106 selects the output of the flipflop 105, and when the clock discriminator signal CKfast is at the low level, the selector 106 selects the test-CAS signal testCAS.

Thus, when the clock discrimination signal CKfast is at the high level, in the data amplifier controller 102, the CAS signal CAS is outputted from the flipflop 109 in time with the clock signal, and supplied through the NAND gates 110 and 111 as the data amplifier enable signal DAE. On the other hand, when the clock discrimination signal CKfast is at the low level, the CAS signal CAS is outputted through the delay 108 and the NAND gates 112 and 111 as the data amplifier enable signal DAE, independently of the timing of the clock signal.

In response to the column selection signal YSW, the memory cell array 103 outputs "n" data signals RT/N to the data amplifiers 141 to 14n, respectively. The data amplifiers 141 to 14n are enabled by the data amplifier enable signal DAE to amplify the "n" data signals RT/N, respectively, to output the output signals Dout.

Figure 6A:
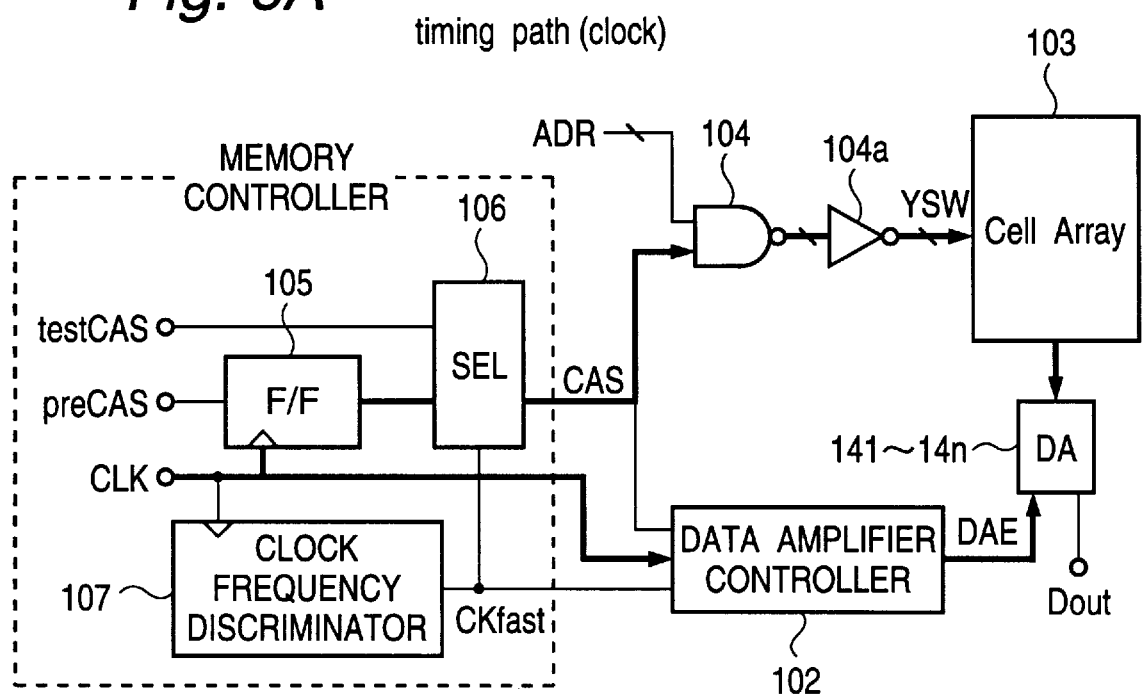
FIGS. 6A, 6B, 6C and 6D are circuit diagrams for illustrating a timing path in the high frequency operation and in the low frequency operation.
Figure 6B:
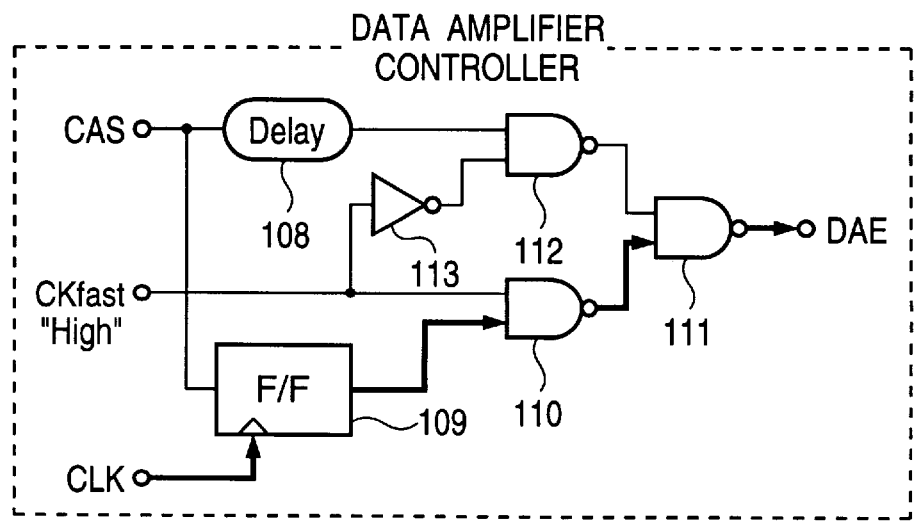

First, an operation when the input clock signal CLK is a high frequency (actual use condition) will be explained with reference to FIGS. 6A and 6B which are circuit diagrams for illustrating a timing path in the high frequency operation. In FIGS. 6A and 6B, thick solid lines indicate an active timing signal path.

Figure 4A:
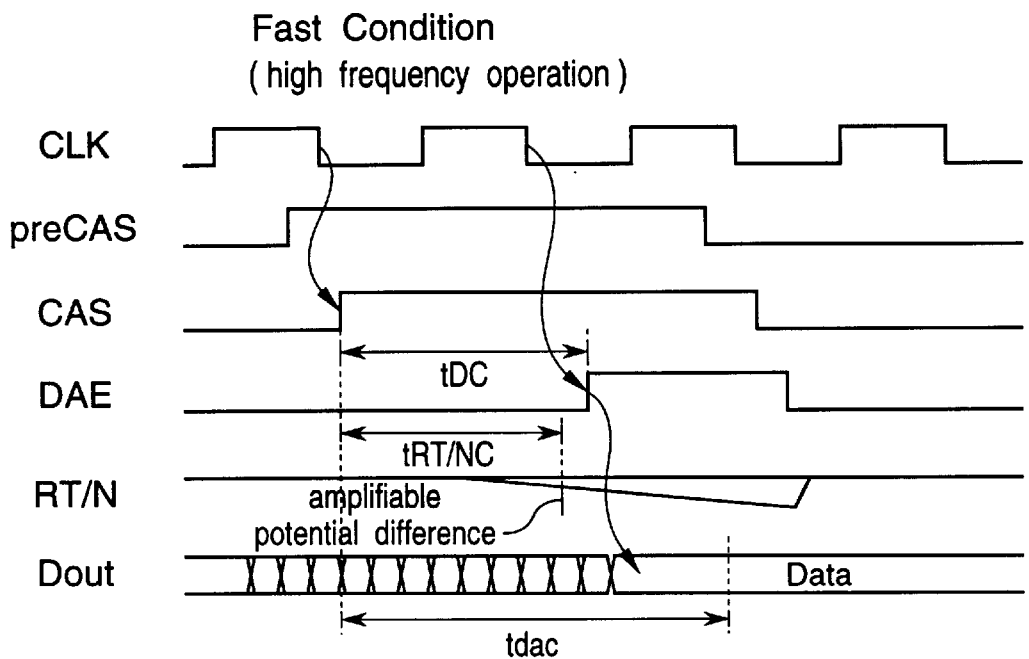
FIGS. 4A and 4B are timing charts illustrating an operation of the first embodiment of the synchronous semiconductor memory in a high frequency operation.
Figure 4B:
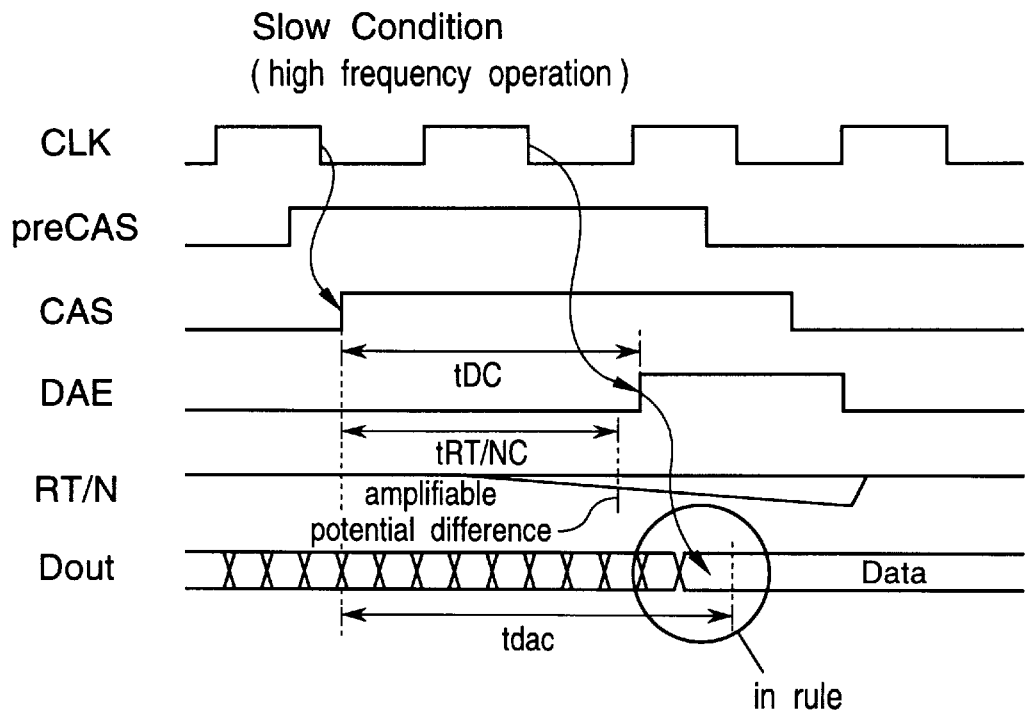

In the high frequency operation, since the clock discrimination signal CKfast is at the high level, the pre-CAS signal preCAS is outputted from the flipflop 105 in time with a clock of the clock signal, and then, outputted through the selector 106 as the CAS signal CAS, as shown in FIGS. 4A and 4B and in FIG. 6A. The CAS signal CAS supplied to the data amplifier controller 102 is outputted as the data amplifier enable signal DAE in time with a clock of the clock signal which is later than the first mentioned clock by one clock cycle, as shown in FIGS. 4A and 4B and in FIG. 6B.

Thus, the data signals RT/N outputted from the memory cell array 103 are amplified by the data amplifiers 141 to 14n enabled by the data amplifier enable signal DAE, and outputted as the output signals Dout.

Figure 6C:
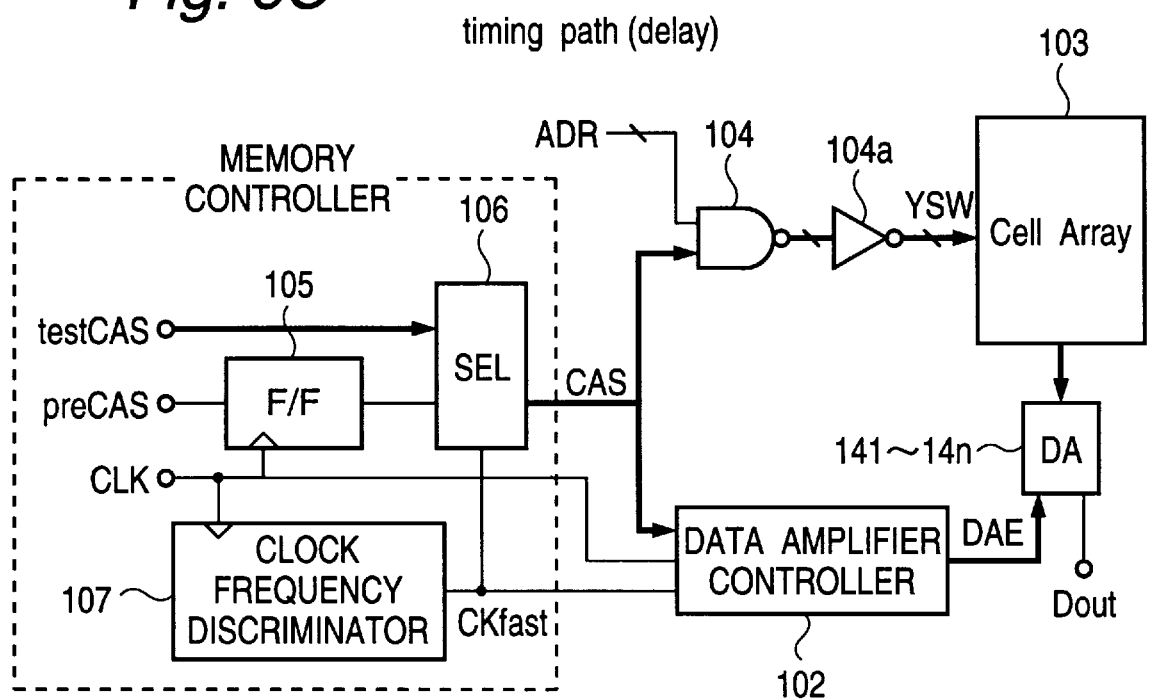
Figure 6D:
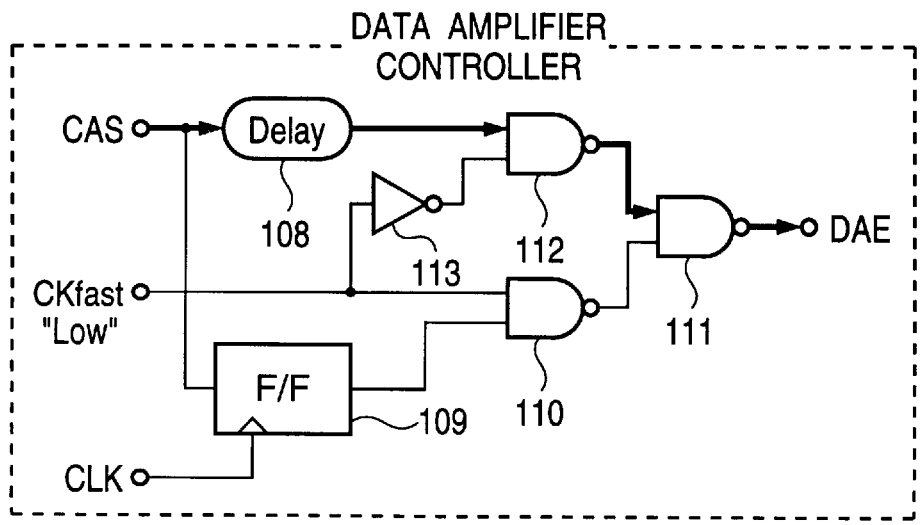

Next, an operation when the input clock signal CLK is a low frequency (test mode condition) will be explained with reference to FIGS. 6C and 6D which are circuit diagrams for illustrating a timing path in the low frequency operation. In FIGS. 6C and 6D, thick solid lines indicate an active timing signal path.

In the low frequency operation, since the clock discrimination signal CKfast is at the low level, the test-CAS signal testCAS is selected by and outputted through the selector 106 as the CAS signal CAS, as shown in FIG. 6C. The CAS signal CAS supplied to the data amplifier controller 102 is outputted as the data amplifier enable signal DAE after a delay time determined by the delay 108, as shown in FIG. 6D. Thus, the data signals RT/N outputted from the memory cell array 103 are amplified by the data amplifiers 141 to 14n enabled by the data amplifier enable signal DAE, and outputted as the output signals Dout.

Referring to FIGS. 4A and 4B, there are shown timing charts illustrating an operation of the first embodiment of the synchronous semiconductor memory in the high frequency operation.

The time from a rising of the CAS signal CAS to the outputting of the output signal Dout is the standardized time tdac, which is determined by the number of clock cycles. Here, it is important that after an amplifiable potential difference has been generated in a data signal RT/N (between a pair of complementary signals) outputted from the memory cell array 103, the data amplifiers 141 to 14n are enabled by the data amplifier enable signal DAE to amplify the data signal RT/N, and that the actual time from the rising of the CAS signal CAS to the outputting of the output signal Dout meets with the standardized time tdac.

Since the time tRT/NC from the rising of the CAS signal CAS to the outputting of the data signal RT/N having the amplifiable potential difference is determined by the fast condition and the slow condition, the timing of the rising of the data amplifier enable signal DAE is determined to meet with the time tRT/NC in the fast condition and the slow condition. In a clock synchronization, the difference between the fast condition and the slow condition in the time tDC from the rising of the CAS signal CAS to the rising of the data amplifier enable signal DAE, is smaller than the difference between the fast condition and the slow condition in the time tRT/NC from the rising of the CAS signal CAS to the outputting of the data signal RT/N having the amplifiable potential difference. Therefore, in the slow condition, after the data signal RT/N has reached the amplifiable potential difference, the data amplifier enable signal DAE is risen up to enable the data amplifiers 141 to 14n, and the access time from the rising of the CAS signal CAS to the outputting of the output signal Dout must come within the standardized time tdac.

Figure 5A:
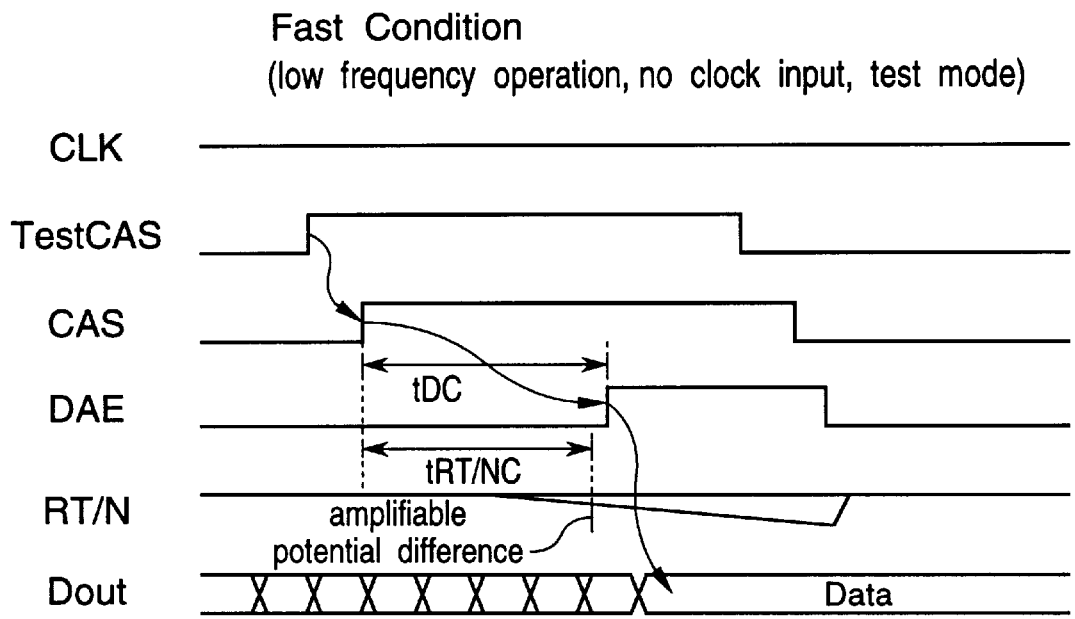
FIGS. 5A and 5B are timing charts illustrating an operation of the first embodiment of the synchronous semiconductor memory in a low frequency operation (test mode)
Figure 5B:
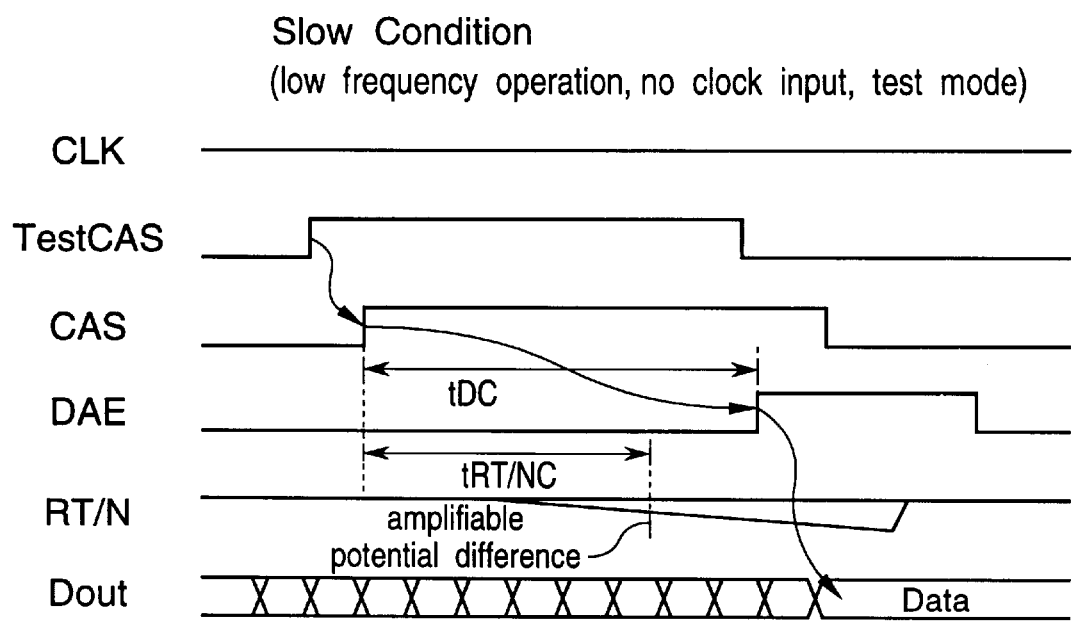

Referring to FIGS. 5A and 5B, there are shown timing charts illustrating an operation of the first embodiment of the synchronous semiconductor memory in the low frequency operation (test mode). In the low frequency operation, since the clock cycle is very long, it can be deemed as if no clock signal CLK is inputted, namely, as if the clock signal CLK is maintained at an inactive level, as shown in FIGS. 5A and 5B. The clock frequency discriminator 107 recognizes this condition of the clock signal and controls the selector 106 to select and output the test-CAS signal testCAS as the CAS signal CAS. As a result, as shown in the timing chart of FIGS. 5A and 5B, a normal reading operation can be obtained, since a sufficient reading margin is ensured in comparison with the standardized time tdac which is determined by the number of clock cycles.

Figure 7A:
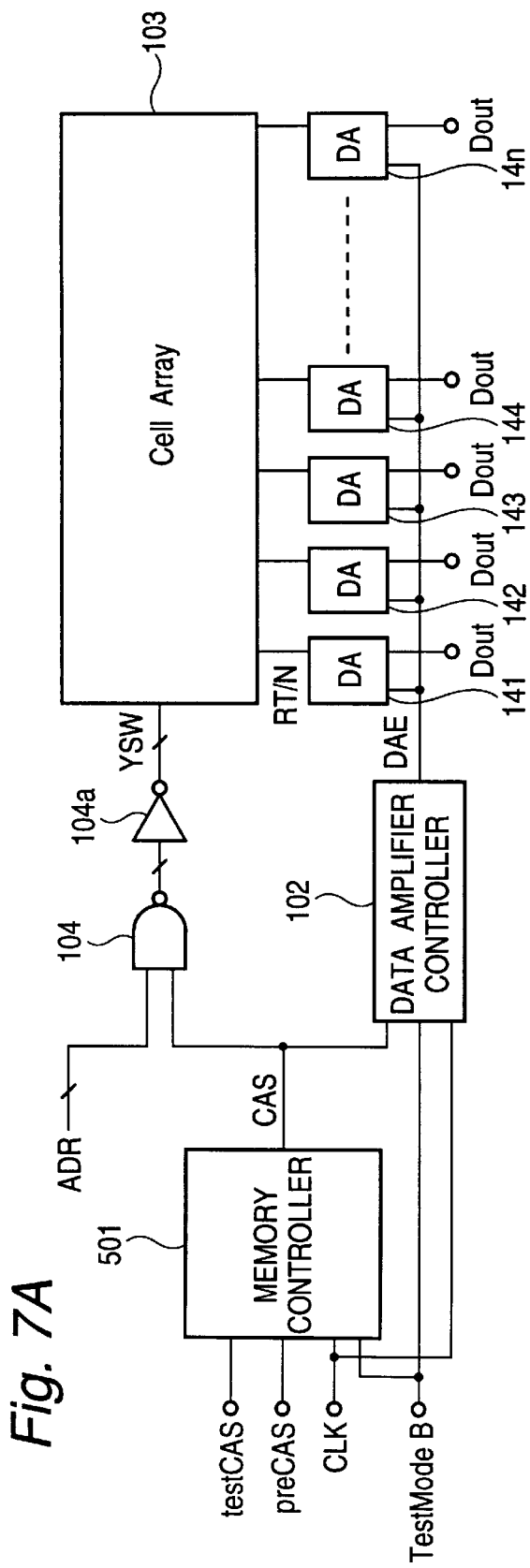
FIGS. 7A, 7B and 7C are block diagrams illustrating a control circuit of a data amplifier section in a second embodiment of the synchronous semiconductor memory in accordance with the present invention.
Figure 7C:
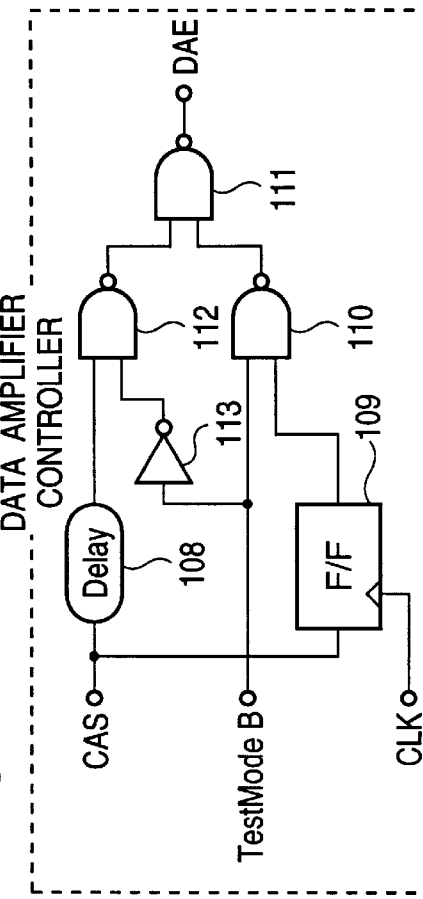
Figure 7B:
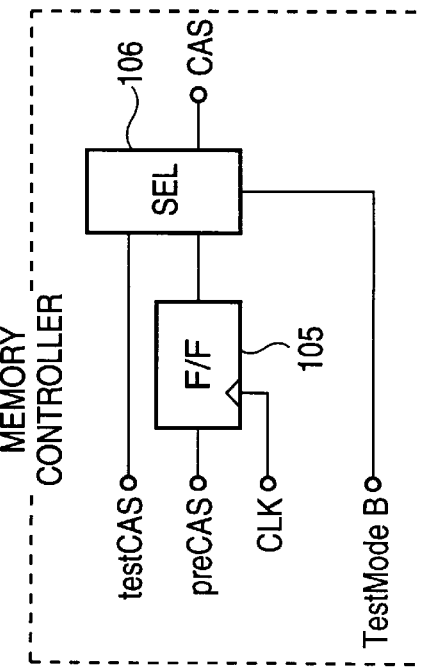

Referring to FIGS. 7A, 7B and 7C, there are shown block diagrams illustrating a control circuit of a data amplifier section in a second embodiment of the synchronous semiconductor memory in accordance with the present invention. This second embodiment is characterized in that the second embodiment has an operation margin larger than that obtained in the first embodiment. In FIGS. 7A, 7B and 7C, elements corresponding to those shown in FIGS. 3A, 3B and 3C are given the same reference numbers, and explanation thereof will be omitted.

The second embodiment of the synchronous semiconductor memory includes a memory controller 501, the data amplifier controller 102, the memory cell array 103 and a number of data amplifiers 141 to 14n, which are coupled as shown. The second embodiment is different from the first embodiment in that, as shown in FIG. 7A, a test mode signal TestMode B is supplied to the memory controller 501 and the data amplifier controller 102, and as shown in FIG. 7B, the memory controller 501 is constituted of only the flipflop 105 and the selector 106. The pre-CAS signal preCAS and the clock signal CLK are supplied to the flipflop 105, and an output of the flipflop 105 is supplied to the selector 106. This selector also receives the test-CAS signal testCAS, and the selector 106 is controlled by the test mode signal TestMode B. When the test mode signal TestMode B is at a high level, the selector 106 selects and outputs the output of the flipflop 105 as the CAS signal CAS. When the test mode signal TestMode B is at a low level, the selector 106 selects and outputs the test-CAS signal as the CAS signal CAS.

In the data amplifier controller 102, the test mode signal TestMode B is supplied in place of the clock discrimination signal CKfast. When the test mode signal TestMode B is at the high level, the CAS signal CAS is outputted from the flipflop 109 in time with the clock signal, and then, outputted through the two-cascaded NAND gates 110 and 111 as the data amplifier enable signal DAE. When the test mode signal TestMode B is at the low level, the CAS signal CAS is outputted through the delay 108 and the two-cascaded NAND gates 112 and 111 as the data amplifier enable signal DAE.

In response to the column selection signal YSW, the memory cell array 103 outputs "n" data signals RT/N to the data amplifier 141 to 14n, respectively. The data amplifiers 141 to 14n are enabled by the data amplifier enable signal DAE to amplify the "n" data signals RT/N, respectively, to output the output signals Dout.

As mentioned above, this second embodiment is characterized in that in place of the clock discrimination signal CKfast is used in the first embodiment, the test mode signal TestMode B is supplied to the data amplifier controller 102, and in an ordinary operation, since the test mode signal TestMode B is brought to the high level, the data amplifier enable signal DAE is generated in synchronism with the clock signal CLK, similarly to the high frequency operation in the first embodiment. As a result, similarly to the first embodiment, since the data amplifier enable signal DAE is in a clock synchronism, an operation margin is extended in comparison with the prior art in which the data amplifier enable signal DAE is generated by a simple asynchronous delay. In the test mode, the test mode signal TestMode B is brought to the low level, the data amplifier enable signal DAE is generated through the delay 108, and therefore, an operation similarly to the first embodiment can be obtained.

As mentioned above, in the prior art, the data amplifier enable signal DAE was generated by delaying the CAS signal CAS by means of the delay regardless of the frequency of the clock signal. Therefore, since variation in the delay amount was large because of a process variation and changes in temperature and in voltage, variation in the timing for enabling the data amplifiers was large, with the result that there was possibility that the access time becomes out of the standardized time tdac.

In the present invention, on the other hand, since there is provided a means for generating the data amplifier enable signal DAE in synchronism with the external clock signal CLK, the data amplifier enable signal DAE is generated in synchronism with a clock signal, and therefore, the data amplifier enable signal DAE is free from a process variation and changes in temperature and in voltage. Accordingly, a satisfactory operation margin can be obtained without being influenced by the variation in the delay amount of the delay.

The invention has thus been shown and described with reference to the specific embodiments. However, it should be noted that the present invention is in no way limited to the details of the illustrated structures but changes and modifications may be made within the scope of the appended claims.

What is claimed is:

1. A synchronous semiconductor memory comprising:
   a memory control means, receiving a pre-CAS signal and a test-CAS signal and being responsive to a mode discrimination signal, for outputting said test-CAS signal as a CAS signal when said mode discrimination signal is active to indicate a test mode, and said pre-CAS signal as said CAS signal when said mode discrimination signal is inactive;
   a data amplifier control means receiving said CAS signal and a clock signal and for generating a data amplifier enable signal at a delay in time with said clock signal when said mode discrimination signal is inactive, said data amplifier control means generating said data amplifier enable signal by delaying said CAS signal independently of said clock signal when said mode discrimination signal is inactive; and
   a memory cell array responding to a column selection signal to output data stored in said memory cell array to associated data amplifiers, so that when said associated data amplifiers are enabled by said data amplifier enable signal, said data is amplified and outputted by said associated data amplifiers.

2. A synchronous semiconductor memory as claimed in claim 1, wherein said data amplifier control means includes an asynchronous delay means for delaying said CAS signal, asynchronously of said clock signal, to generate said data amplifier enable signal, and a clock-synchronized circuit receiving said CAS signal to delay said CAS signal, in synchronism with said clock signal, for generating said data amplifier enable signal in synchronism with said clock signal.

3. A synchronous semiconductor memory as claimed in claim 2, wherein said CAS signal is supplied to said asynchronous delay means, and said clock-synchronized circuit comprises a flipflop means receiving said CAS signal and said clock signal, and wherein said data amplifier control means further includes a first NAND gate receiving an output of said asynchronous delay means and also receiving through an inverter said mode discrimination signal, a second NAND gate receiving said mode discrimination signal and an output of said flipflop means, and a third NAND gate receiving an output of said first NAND gate and an output of said second NAND gate for outputting said data amplifier enable signal.

4. A synchronous semiconductor memory as claimed in claim 3, wherein when said mode discrimination signal is inactive, said flipflop means receiving said CAS signal and said clock signal, generates said data amplifier enable signal from said CAS signal, in synchronism with a clock of said clock signal which is later, by one clock cycle, than a clock of said clock signal in synchronism with which said CAS signal is generated, and when said mode discrimination signal is active, said clock signal has a frequency lower than that of said clock signal when said mode discrimination signal is inactive, so that said asynchronous delay means generates said data amplifier enable signal, by delaying said CAS signal, asynchronously of said clock signal.

5. A synchronous semiconductor memory as claimed in claim 3, wherein said memory control means includes a clock frequency discriminator receiving said clock signal for generating said mode discrimination signal which is active when the frequency of said clock signal is low and which is inactive when the frequency of said clock signal is high, a flipflop receiving said pre-CAS signal and said clock signal for latching said pre-CAS signal in synchronism with said clock signal, and a selector receiving said test-CAS signal and an output of said flipflop and controlled by said mode discrimination signal so as to select said test-CAS signal as said CAS signal when said mode discrimination signal is active and said output of said flipflop as said CAS signal when said mode discrimination signal is inactive.

6. A synchronous semiconductor memory as claimed in claim 3, wherein said mode discrimination signal is an externally supplied test mode signal, and wherein said memory control means includes a flipflop receiving said pre-CAS signal and said clock signal for latching said pre-CAS signal in synchronism with said clock signal, and a selector receiving said test-CAS signal and an output of said flipflop and controlled by said test mode signal so as to select said test-CAS signal as said CAS signal when said test mode signal is active and said output of said flipflop as said CAS signal when said test mode signal is inactive.

7. A synchronous semiconductor memory as claimed in claim 1, wherein said memory control means includes a clock frequency discriminator receiving said clock signal for generating said mode discrimination signal which is active when the frequency of said clock signal is low and which is inactive when the frequency of said clock signal is high, a flipflop receiving said pre-CAS signal and said clock signal for latching said pre-CAS signal in synchronism with said clock signal, and a selector receiving said test-CAS signal and an output of said flipflop and controlled by said mode discrimination signal so as to select said test-CAS signal as said CAS signal when said mode discrimination signal is active and said output of said flipflop as said CAS signal when said mode discrimination signal is inactive.

8. A synchronous semiconductor memory as claimed in claim 1, wherein said mode discrimination signal is an externally supplied test mode signal, and wherein said memory control means includes a flipflop receiving said pre-CAS signal and said clock signal for latching said pre-CAS signal in synchronism with said clock signal, and a selector receiving said test-CAS signal and an output of said flipflop and controlled by said test mode signal so as to select said test-CAS signal as said CAS signal when said test mode signal is active and said output of said flipflop as said CAS signal when said test mode signal is inactive.

9. A synchronous semiconductor memory comprising:

a memory controller which receives a pre-CAS signal and a test-CAS signal, is responsive to a mode discrimination signal, outputs said test-CAS signal as a CAS signal when said mode discrimination signal is active to indicate a test mode, and outputs said pre-CAS signal as said CAS signal when said mode discrimination signal is inactive;

a data amplifier controller means receiving said CAS signal and a clock signal and generating a data amplifier enable signal at a delay in time with said clock signal when said mode discrimination signal is inactive, said data amplifier controller generating said data amplifier enable signal by delaying said CAS signal independently of said clock signal when said mode discrimination signal is inactive; and a memory cell array responding to a column selection signal to output data stored in said memory cell array to associated data amplifiers, so that when said associated data amplifiers are enabled by said data amplifier enable signal, said data is amplified and outputted by said associated data amplifiers.

10. A synchronous semiconductor memory as claimed in claim 9, wherein said data amplifier controller includes an asynchronous delay which delays said CAS signal, asynchronously of said clock signal, to generate said data amplifier enable signal, and a clock-synchronized circuit receiving said CAS signal to delay said CAS signal, in synchronism with said clock signal, for generating said data amplifier enable signal in synchronism with said clock signal.

11. A synchronous semiconductor memory as claimed in claim 10, wherein said CAS signal is supplied to said asynchronous delay, and said clock-synchronized circuit comprises a flipflop receiving said CAS signal and said clock signal, and wherein said data amplifier controller further includes a first NAND gate receiving an output of said asynchronous delay and also receiving through an inverter said mode discrimination signal, a second NAND gate receiving said mode discrimination signal and an output of said flipflop, and a third NAND gate receiving an output of said first NAND gate and an output of said second NAND gate for outputting said data amplifier enable signal.

12. A synchronous semiconductor memory as claimed in claim 11, wherein when said mode discrimination signal is inactive, said flipflop receiving said CAS signal and said clock signal, generates said data amplifier enable signal from said CAS signal, in synchronism with a clock of said clock signal which is later, by one clock cycle, than a clock of said clock signal in synchronism with which said CAS signal is generated, and when said mode discrimination signal is active, said clock signal has a frequency lower than that of said clock signal when said mode discrimination signal is inactive, so that said asynchronous delay generates said data amplifier enable signal, by delaying said CAS signal, asynchronously of said clock signal.

13. A synchronous semiconductor memory as claimed in claim 11, wherein said memory controller includes a clock frequency discriminator receiving said clock signal and generating said mode discrimination signal which is active when the frequency of said clock signal is low and which is inactive when the frequency of said clock signal is high, a flipflop receiving said pre-CAS signal and said clock signal for latching said pre-CAS signal in synchronism with said clock signal, and a selector receiving said test-CAS signal and an output of said flipflop and controlled by CAS mode discrimination signal so as to select said test-CAS signal as said CAS signal when said mode discrimination signal is active and said output of said flipflop as said CAS signal when said mode discrimination signal is inactive.

14. A synchronous semiconductor memory as claimed in claim 11, wherein said mode discrimination signal is an externally supplied test mode signal, and wherein said memory controller includes a flipflop receiving said pre-CAS signal and said clock signal and latching said pre-CAS signal in synchronism with said clock signal, and a selector receiving said test-CAS signal and an output of said flipflop and controlled by said test mode signal so as to select said test-CAS signal as said CAS signal when said test mode signal is active and said output of said flipflop as said CAS signal when said test mode signal is inactive.

15. A synchronous semiconductor memory as claimed in claim 9, wherein said memory controller includes a clock frequency discriminator receiving said clock signal for generating said mode discrimination signal which is active when the frequency of said clock signal is low and which is inactive when the frequency of said clock signal is high, a flipflop receiving said pre-CAS signal and said clock signal for latching said pre-CAS signal in synchronism with said clock signal, and a selector receiving said test-CAS signal and an output of said flipflop and controlled by said mode discrimination signal so as to select said test-CAS signal as said CAS signal when said mode discrimination signal is active and said output of said flipflop as said CAS signal when said mode discrimination signal is inactive.

16. A synchronous semiconductor memory as claimed in claim 9, wherein said mode discrimination signal is an externally supplied test mode signal, and wherein said memory controller includes a flipflop receiving said pre-CAS signal and said clock signal and for latching said pre-CAS signal in synchronism with said clock signal, and a selector receiving said test-CAS signal and an output of said flipflop and controlled by said test mode signal so as to select said test-CAS signal as said CAS signal when said test mode signal is active and said output of said flipflop as said CAS signal when said test mode signal is inactive.

* * * * *